(12) United States Patent
Nakano

(10) Patent No.: US 11,487,170 B2
(45) Date of Patent: Nov. 1, 2022

(54) DISPLAY DEVICE AND METHOD FOR MANUFACTURING DISPLAY DEVICE

(71) Applicant: Japan Display Inc., Tokyo (JP)

(72) Inventor: Yasushi Nakano, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/205,101

(22) Filed: Mar. 18, 2021

(65) Prior Publication Data

US 2021/0223597 A1 Jul. 22, 2021

Related U.S. Application Data

(63) Continuation of application No. PCT/JP2019/037377, filed on Sep. 24, 2019.

(30) Foreign Application Priority Data

Sep. 25, 2018 (JP) .............................. JP2018-178968

(51) Int. Cl.
*G02F 1/1345* (2006.01)
*H01L 23/544* (2006.01)
(Continued)

(52) U.S. Cl.
CPC ...... *G02F 1/13452* (2013.01); *G02F 1/13458* (2013.01); *H01L 23/544* (2013.01);
(Continued)

(58) Field of Classification Search
CPC ....... H05K 1/0266–0269; H05K 1/189; H05K 5/0252; H05K 2202/09918;
(Continued)

(56) References Cited

U.S. PATENT DOCUMENTS

2003/0053056 A1 3/2003 Ohazama
2007/0275578 A1 11/2007 Yamada
(Continued)

FOREIGN PATENT DOCUMENTS

CN 1632648 A 6/2005
JP 07-329914 A 12/1995
(Continued)

OTHER PUBLICATIONS

Office Action dated May 10, 2022, in corresponding Japanese Patent Application No. 2018-178968 (English Translation only), 6 pages.
(Continued)

*Primary Examiner* — Hoa C Nguyen
(74) *Attorney, Agent, or Firm* — Maier & Maier, PLLC

(57) ABSTRACT

According to one embodiment, a display device includes a display panel including a first substrate, and a wiring board mounted on a mounting portion of the first substrate. The display panel includes a first terminal and a second terminal located in the mounting portion, a first alignment mark located in the mounting portion and located between the first terminal and the second terminal, a first wiring line connected to the first terminal, and a second wiring line connected to the second terminal. The wiring board includes a first connection wiring line connected to the first terminal, a second connection wiring line connected to the second terminal, and a second alignment mark located between the first connection wiring line and the second connection wiring line.

6 Claims, 12 Drawing Sheets

(51) Int. Cl.
*H01L 23/00* (2006.01)
*H05K 1/02* (2006.01)
*H05K 1/18* (2006.01)
*G02F 1/1333* (2006.01)

(52) U.S. Cl.
CPC ........... *H01L 24/83* (2013.01); *H05K 1/0266* (2013.01); *H05K 1/0269* (2013.01); *H05K 1/189* (2013.01); *G02F 1/133354* (2021.01); *H01L 2223/54413* (2013.01); *H01L 2223/54426* (2013.01); *H01L 2224/8313* (2013.01); *H01L 2224/83132* (2013.01); *H05K 2201/09227* (2013.01); *H05K 2201/09781* (2013.01); *H05K 2201/09918* (2013.01); *H05K 2201/10136* (2013.01)

(58) Field of Classification Search
CPC .......... H05K 2202/09936; H05K 2202/09227; H05K 2202/09781; H05K 2202/10136; H01L 23/544; G02F 1/13452
See application file for complete search history.

(56) References Cited

U.S. PATENT DOCUMENTS

| 2017/0184903 | A1* | 6/2017 | Fujikawa | G02F 1/13458 |
| 2017/0357122 | A1* | 12/2017 | Oh | H01L 27/3276 |
| 2018/0032190 | A1* | 2/2018 | Koide | G02F 1/13338 |
| 2019/0116662 | A1* | 4/2019 | Li | G02F 1/1309 |
| 2019/0116672 | A1* | 4/2019 | Zhao | G02F 1/133305 |

FOREIGN PATENT DOCUMENTS

| JP | 2002-122877 A | 4/2002 |
| JP | 2003-086999 A | 3/2003 |
| JP | 2003-131584 A | 5/2003 |
| JP | 2008-01 0829 A | 1/2008 |

OTHER PUBLICATIONS

International Search Report dated Nov. 26, 2019 in PCT/JP2019/037377 filed on Sep. 24, 2019, 2 pages.

* cited by examiner

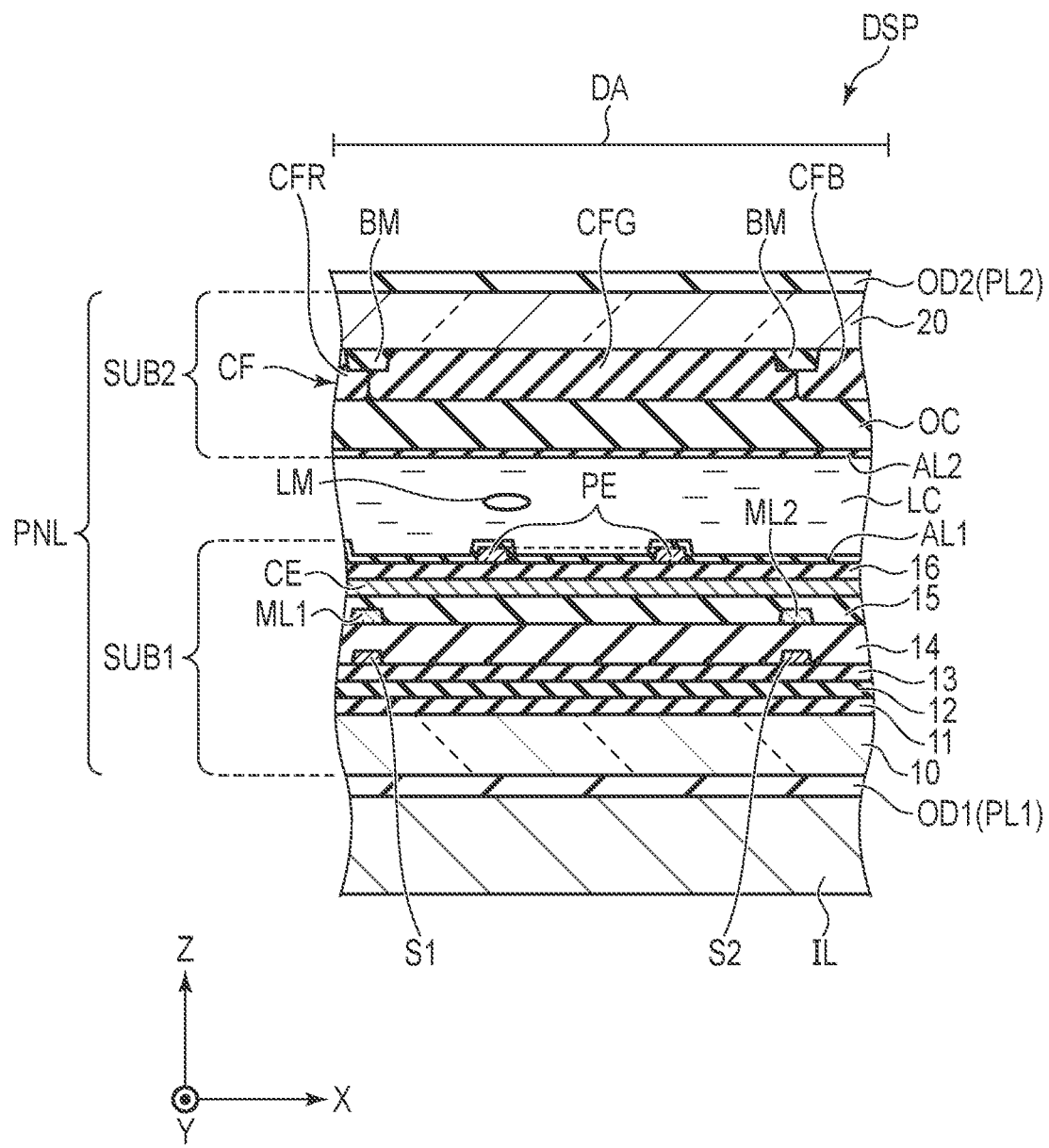
F I G. 2

DISPLAY DEVICE AND METHOD FOR MANUFACTURING DISPLAY DEVICE

CROSS-REFERENCE TO RELATED APPLICATIONS

This application is a Continuation Application of PCT Application No. PCT/JP2019/037377, filed Sep. 24, 2019 and based upon and claiming the benefit of priority from Japanese Patent Application No. 2018-178968, filed Sep. 25, 2018, the entire contents of all of which are incorporated herein by reference.

FIELD

Embodiments described herein relate generally to a display device and a method for manufacturing a display device.

BACKGROUND

Recently, demand for display devices for mobile electronic devices and the like has been increasing. As the display device, a structure including a display panel and a wiring board mounted on the display panel is known. It is also known that a driving circuit for driving the display panel is mounted on the wiring board. In this structure, a driving signal output from the driving circuit is supplied to the display panel via wiring lines of the wiring board.

BRIEF DESCRIPTION OF THE DRAWINGS

FIG. 2 is a cross-sectional view of a display area of a display panel shown in FIG. 1.

DETAILED DESCRIPTION

Figure 1:
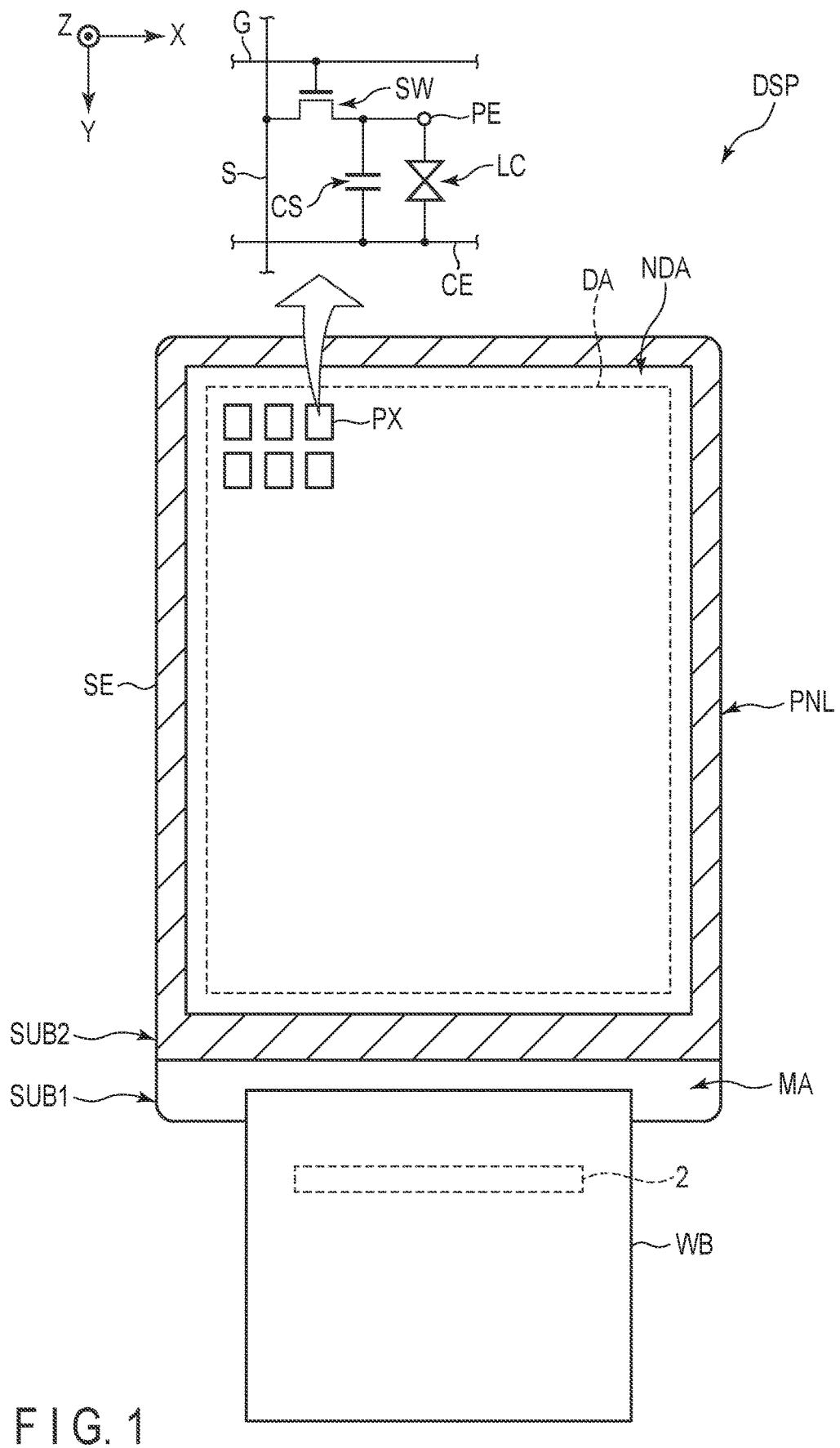
FIG. 1 is an illustration showing the configuration and the equivalent circuit of a display device of the present embodiment.

In general, according to one embodiment, there is provided a display device comprising: a display panel comprising a first substrate; and a wiring board mounted on a mounting portion of the first substrate. The display panel comprises a first terminal and a second terminal located in the mounting portion, a first alignment mark located in the mounting portion and located between the first terminal and the second terminal, a first wiring line connected to the first terminal, and a second wiring line connected to the second terminal. The wiring board comprises a first connection wiring line connected to the first terminal, a second connection wiring line connected to the second terminal, and a second alignment mark located between the first connection wiring line and the second connection wiring line.

According to another embodiment, there is provided a method for manufacturing a display device comprising: a display panel comprising a first substrate; and a wiring board mounted on a mounting portion of the first substrate, wherein the display panel comprises a first terminal and a second terminal located in the mounting portion, a first alignment mark located in the mounting portion and located between the first terminal and the second terminal, a first wiring line connected to the first terminal, and a second wiring line connected to the second terminal, and the wiring board comprises a first connection wiring line connected to the first terminal, a second connection wiring line connected to the second terminal, and a second alignment mark located between the first connection wiring line and the second connection wiring line. The method comprises: sucking the wiring substrate by a suction device comprising a first suction port and a second suction port, wherein the suction device sucks the wiring substrate such that the first suction port is positioned overlapping the first connection wiring line, the second suction port is positioned overlapping the second connection wiring line, and both sides of the second alignment mark are sucked; aligning the display panel and the wiring board by the first alignment mark and the second alignment mark; and connecting the first terminal and the first connection wiring line together and the second terminal and the second connection wiring line together by an anisotropic conductive film.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed description of them is omitted unless necessary.

The main configuration of the present embodiment can be used for an electronic device comprising a flexible wiring board such as a display device. In the present specification, the configuration of the present embodiment will be described by taking a display device as an example. This display device can be used for various devices such as a smartphone, a tablet computer, a portable telephone, a notebook computer, an in-car device and a game console. In addition, the present embodiment can be applied to various display devices such as a liquid crystal display device, a self-luminous display device such as an organic electroluminescent display device, a micro-LED display device, an electronic paper display device comprising an electrophoretic element or the like, a display device employing microelectromechanical systems (MEMS), and a display device employing electrochromism. The present embodiment can also be applied to a wearable display device or a variant display device.

FIG. 1 is an illustration showing the configuration and the equivalent circuit of the display device DSP of the present embodiment.

In one example, a first direction X, a second direction Y and a third direction Z are orthogonal to one another. However, they may cross one another at an angle other than 90 degrees. The first direction X and the second direction Y correspond to directions parallel to the main surface of a substrate constituting the display device DSP, and the third direction Z corresponds to the thickness direction of the display device DSP. In the present specification, a direction toward the point of an arrow indicating the third direction Z is referred to as upward (or simply above), and a direction from the point of the arrow toward the opposite side is referred to as downward (or simply below).

The display device DSP comprises a display panel PNL and a wiring board WB mounted on the display panel PNL. The display panel PNL is a liquid crystal display panel, and comprises a first substrate SUB1, a second substrate SUB2 opposed to the first substrate SUB1, a sealing member SE, a liquid crystal layer LC, a signal line S, a scanning line G, a switching element SW, a pixel electrode PE, a common electrode CE and the like. In addition, the display panel PNL comprises a display area DA which displays an image and a non-display area NDA which surrounds the display area DA.

The first substrate SUB1 comprises a mounting portion MA exposed to the outside of the second substrate SUB2. The sealing member SE is located in the non-display area NDA and bonds the first substrate SUB1 and the second substrate SUB2 together. In FIG. 1, an area in which the sealing member SE is disposed is indicated by upward-sloping hatch lines. The display area DA is located inside surrounded by the sealing member SE. The display panel PNL comprises a plurality of pixels PX disposed in a matrix in the first direction X and the second direction Y in the display area DA.

The signal line S, the scanning line G, the switching element SW, the pixel electrode PE, the common electrode CE and the liquid crystal layer LC are located in the display area DA. The signal line S extends along the second direction Y, and the scanning line G extends along the first direction X. The switching element SW is composed of, for example, a thin-film transistor (TFT), and is electrically connected to the scanning line G and the signal line S. The pixel electrode PE is electrically connected to the switching element SW. Each pixel electrode PE is opposed to the common electrode CE, and drives the liquid crystal layer LC by an electric field produced between the pixel electrode PE and the common electrode CE. A storage capacitance CS is formed, for example, between an electrode of the same potential as the common electrode CE and an electrode of the same potential as the pixel electrode PE.

The flexible wiring board WB is mounted on the mounting portion MA. In addition, the wiring board WB comprises a driver IC chip 2 which drives the display panel PNL. Note that the driver IC chip 2 may be mounted on the mounting portion MA.

The display panel PNL of the present embodiment may be any one of a transmissive type comprising a transmissive display function of displaying an image by selectively transmitting light from the rear side of the first substrate SUB1, a reflective type comprising a reflective display function of displaying an image by selectively reflecting light from the front side of the second substrate SUB2, and a transflective type comprising the transmissive display function and the reflective display function.

In addition, although the description of the detailed configuration of the display panel PNL will be omitted here, the display panel PNL may comprise a configuration corresponding to any one of a display mode using a lateral electric field along the main surface of a substrate, a display mode using a longitudinal electric field along a normal to the main surface of a substrate, a display mode using an inclined electric field inclined in an oblique direction with respect to the main surface of a substrate, and a display mode using an arbitrary combination of the lateral electric field, the longitudinal electric field and the inclined electric field. The main surface of a substrate here is a surface parallel to an XY-plane defined by the first direction X and the second direction Y.

FIG. 2 is a cross-sectional view of the display area DA of the display panel PNL shown in FIG. 1. The illustrated example corresponds to an example where the display mode using the lateral electric field is applied to the display panel PNL.

The display device DSP comprises a first optical element OD1, a second optical element OD2 and an illumination device IL in addition to the display panel PNL.

The first substrate SUB1 comprises an insulating substrate 10, insulating films 11 to 16, signal lines S1 and S2, metal wiring lines ML1 and ML2, the common electrode CE, the pixel electrode PE, and an alignment film AL1. The insulating substrate 10 is a substrate having optical transparency such as a glass substrate or a flexible resin substrate. The insulating film 11 is located on the insulating substrate 10. The insulating film 12 is located on the insulating film 11. The insulating film 13 is located on the insulating film 12. The signal lines S1 and S2 are located on the insulating film 13, and are covered with the insulating film 14. The metal wiring lines ML1 and ML2 are located on the insulating film 14, and are covered with the insulating film 15. The metal wiring lines ML1 and ML2 are located directly above the signal lines S1 and S2, respectively. The common electrode CE is located on the insulating film 15, and is covered with the insulating film 16. The pixel electrode PE is located on the insulating film 16, and is covered with the alignment film AL1. The common electrode CE and the pixel electrode PE are transparent electrodes formed of a transparent conductive material such as indium tin oxide (ITO) or indium zinc oxide (IZO).

The insulating films 11 to 13 and the insulating film 16 are inorganic insulating films formed of an inorganic insulating material such as silicon oxide, silicon nitride or silicon oxynitride, and may have a single-layer structure or a multilayer structure. The insulating films 14 and 15 are organic insulating films formed of an organic insulating material such as acrylic resin, for example.

The second substrate SUB2 comprises an insulating substrate 20, a light-shielding layer BM, a color filter CF, an overcoat layer OC, an alignment film AL2 and the like. Similarly to the insulating substrate 10, the insulating substrate 20 is a substrate having optical transparency such as a glass substrate or a resin substrate. The light-shielding layer BM and the color filter CF are located on a side of the insulating substrate 20 which is opposed to the first substrate SUB1. The color filter CF is disposed at a position opposed to the pixel electrode PE, and partially overlaps the light-shielding layer BM. The color filter CF comprises a red color filter CFR, a green color filter CFG and a blue color filter CFB. The overcoat layer OC covers the color filter CF. The overcoat layer OC is formed of transparent resin. The alignment film AL2 covers the overcoat layer OC. The alignment film AL1 and the alignment film AL2 are formed of, for example, a material exhibiting horizontal alignment properties.

The first substrate SUB1 and the second substrate SUB2 are disposed such that the alignment film AL1 and the alignment film AL2 are opposed to each other. The first substrate SUB1 and the second substrate SUB2 are bonded by the sealing member with a predetermined cell gap in between. The liquid crystal layer LC is held between the alignment film AL1 and the alignment film AL2. The liquid crystal layer LC comprises liquid crystal molecules LM. The liquid crystal layer LC is composed of a positive liquid crystal material (whose dielectric anisotropy is positive) or a negative liquid crystal material (whose dielectric anisotropy is negative).

The first optical element OD1 including a polarizer PL1 is bonded to the insulating substrate 10. The second optical element OD2 including a polarizer PL2 is bonded to the insulating substrate 20. The first optical element OD1 and the second optical element OD2 may each comprise a retarder, a scattering layer, an antireflective layer and the like as needed.

In this display panel PNL, in an off state where no electric field is formed between the pixel electrode PE and the common electrode CE, the liquid crystal molecules LM are initially aligned in a predetermined direction between the alignment film AL1 and the alignment film AL2. In this off state, light emitted from the illumination device IL toward the display panel PNL is absorbed by the first optical element OD1 and the second optical element OD2, and dark display is realized. On the other hand, in an on state where an electric field is formed between the pixel electrode PE and the common electrode CE, the liquid crystal molecules LM are aligned in a direction different from the initial alignment direction by an electric field, and the alignment direction is controlled by the electric field. In this on state, a part of the light from the illumination device IL is transmitted through the first optical element OD1 and the second optical element OD2, and light display is realized.

Figure 3:
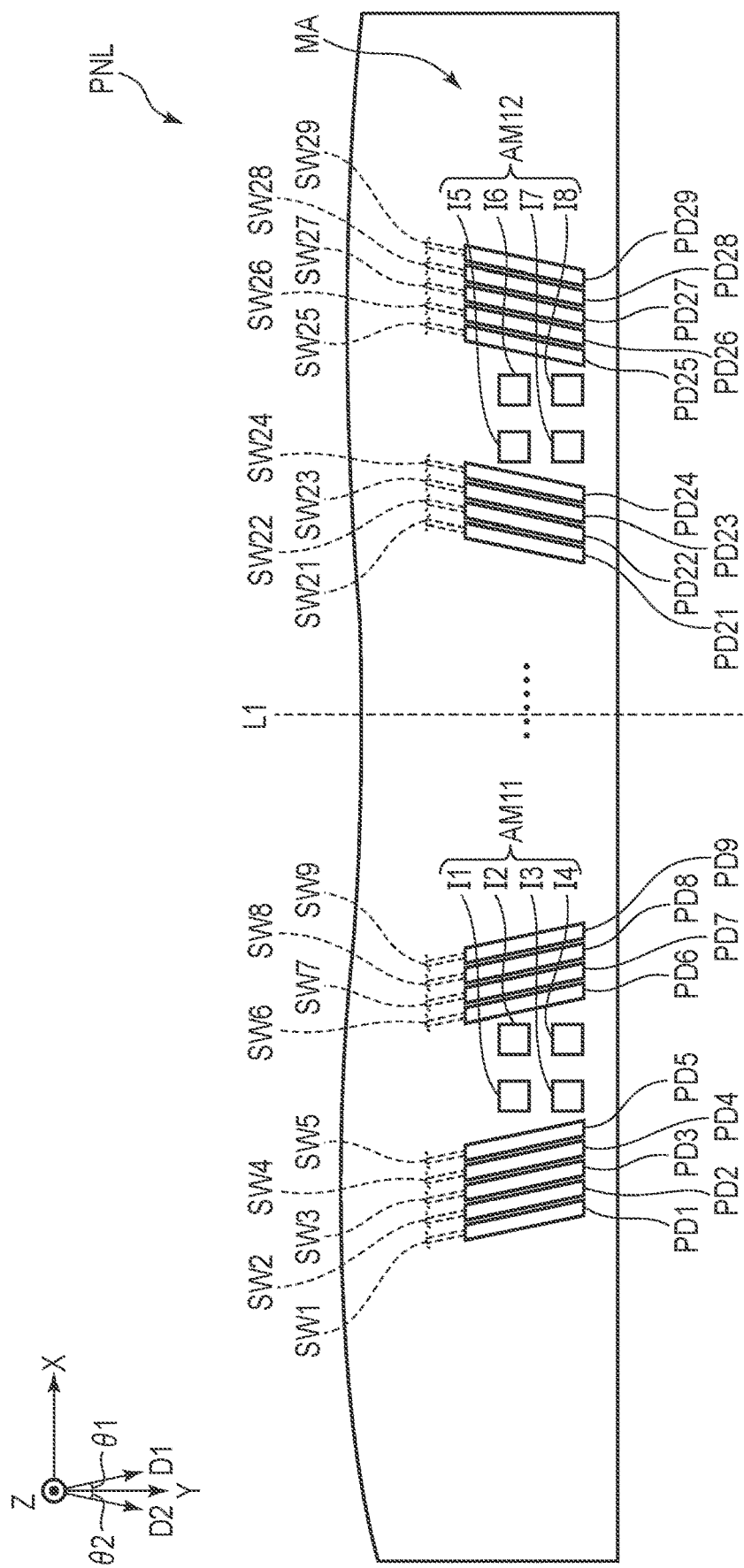
FIG. 3 is a plan view showing a mounting portion of the display panel.

FIG. 3 is a plan view showing the mounting portion MA of the display panel PNL. In the drawing, a direction crossing at an acute angle counterclockwise with respect to the second direction Y is defined as a direction D1, and a direction crossing at an acute angle clockwise with respect to the second direction Y is defined as a direction D2. An angle θ1 between the second direction Y and the direction D1 is substantially equal to an angle θ2 between the second direction Y and the direction D2.

The display panel PNL comprises terminals PD1 to PD9 located in the mounting portion MA, terminals PD21 to PD29, alignment marks AM11 and AM12 located in the mounting portion MA, signal wiring lines SW1 to SW9 connected respectively to the terminals PD1 and PD9, and signal wiring lines SW21 to SW29 connected respectively to the terminals PD21 to PD29. In addition, the signal wiring lines SW can also be referred to simply as wiring lines SW, and wiring lines drawn from the terminals PD of the mounting portion MA may be wiring lines which supply a signal for driving the display panel PNL from the driver IC chip, and each are a power supply line or a wiring line which supplies a voltage of a fixed potential or the like.

Furthermore, in one example, the wiring lines SW1 to SW5 are power supply lines which supply various voltages to the display panel PNL, and the wiring lines SW6 to SW9 are signal wiring lines which supply various signals to the display panel PNL. Wiring lines clustered across the alignment mark AM which will be described later can be grouped according to a purpose or a function.

The alignment mark AM11 is located between the terminal PD5 and the terminal PD6. The alignment mark AM12 is located between the terminal PD24 and the terminal PD25. The terminals PD1 to PD5, the alignment mark AM11 and the terminals PD6 to PD9 are arranged in parallel in this order in the first direction X. In addition, the terminals PD21 to PD24, the alignment mark AM12 and the terminals PD25 to PD29 are arranged in parallel in this order in the first direction X. The alignment mark AM11 comprises an island portion I1, an island portion I2 arranged in parallel in the first direction X of the island portion I1, an island portion I3 arranged in parallel in the second direction Y of the island portion I1, and an island portion I4 arranged in parallel in the second direction Y of the island portion I2. The alignment mark AM12 comprises an island portion I5, an island portion I6 arranged in parallel in the first direction X of the island portion I5, an island portion I7 arranged in parallel in the second direction Y of the island portion I5, and an island portion I8 arranged in parallel in the second direction Y of the island portion I6. The island portions I1 to I8 are formed in, for example, a rectangular shape. However, they are not limited to a rectangular shape but may be formed in any shape as long as they have a function as an alignment mark.

The center position of the width along the first direction X of the mounting portion MA is defined as a center line L1. The center line L1 is parallel to the second direction Y. The terminals PD1 to PD9, the signal wiring lines SW1 to SW9, and the alignment mark AM11 are located on the left side of the center line L1. The terminals PD21 to PD29, the signal wiring lines SW21 to SW29, and the alignment mark AM12 are located on the right side of the center line L1. The alignment marks AM11 and AM12 are disposed at positions substantially symmetric with respect to the center line L1. In addition, the signal wiring lines SW1 to SW9 extend along the direction D1. The signal wiring lines SW21 to SW29 extend along the direction D2.

Figure 4:
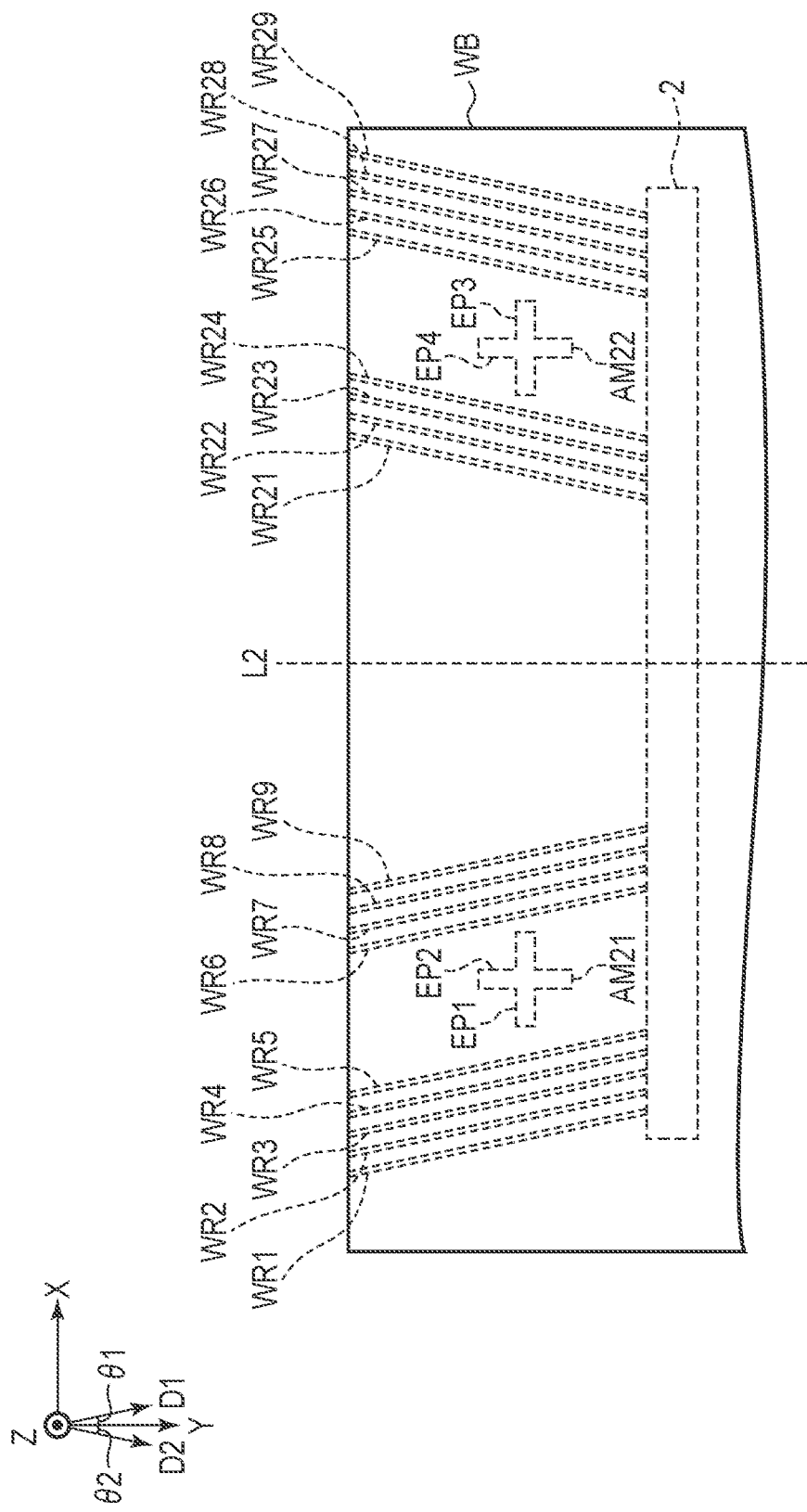
FIG. 4 is a plan view showing a part of a wiring board.

FIG. 4 is a plan view showing a part of the wiring board WB.

The wiring board WB comprises connection wiring lines WR1 to WR9, connection wiring lines WR21 to WR29, and alignment marks AM21 and AM22. The connection wiring lines WR1 to WR9 and the connection wiring lines WR21 to WR29 are connected to the driver IC chip 2. In addition, the connection wiring lines WR can also be referred to simply as wiring lines WR but are referred to as connection wiring lines in the present specification simply because the wiring lines WR of the wiring board WB are connected to the display panel PNL.

The alignment mark AM21 is located between the connection wiring line WR5 and the connection wiring line WR6. The alignment mark AM22 is located between the connection wiring line WR24 and the connection wiring line WR25. In addition, the connection wiring lines WR1 to WR5, the alignment mark AM21, and the connection wiring lines WR6 to WR9 are arranged in parallel in this order in the first direction X. The connection wiring lines WR21 to WR24, the alignment mark AM22, and the connection wiring lines WR25 to WR29 are arranged in parallel in this order in the first direction X. The alignment mark AM21 is formed in a cross shape comprising an extension portion EP1 extending in the first direction X and an extension portion EP2 extending in the second direction Y. The alignment mark AM22 is formed in a cross shape comprising an extension portion EP3 extending in the first direction X and an extension portion EP4 extending in the second direction Y. In addition, the alignment marks of the wiring board WB are not limited to a cross shape but may be formed in any shape as long as they have a function as an alignment mark.

The center position of the width in the first direction X of the wiring board WB is defined as a center line L2. The center line L2 is parallel to the second direction Y. The connection wiring lines WR1 to WR9 and the alignment mark AM21 are located on the left side of the center line L2. The connection wiring lines WR21 to WR29 and the alignment mark AM22 are located on the right side of the center line L2. The alignment marks AM21 and AM22 are disposed at positions substantially symmetric with respect to the center line L2. In addition, the connection wiring lines WR1 to WR9 extend along the direction D1. The connection wiring lines WR21 to WR29 extend along the direction D2.

The connection wiring lines WR1 to WR9 and WR21 to WR29, and the alignment marks AM21 to AM22 are formed of, for example, a metal film such as copper, and the surface of the metal film is plated with tin or the like.

Figure 5:
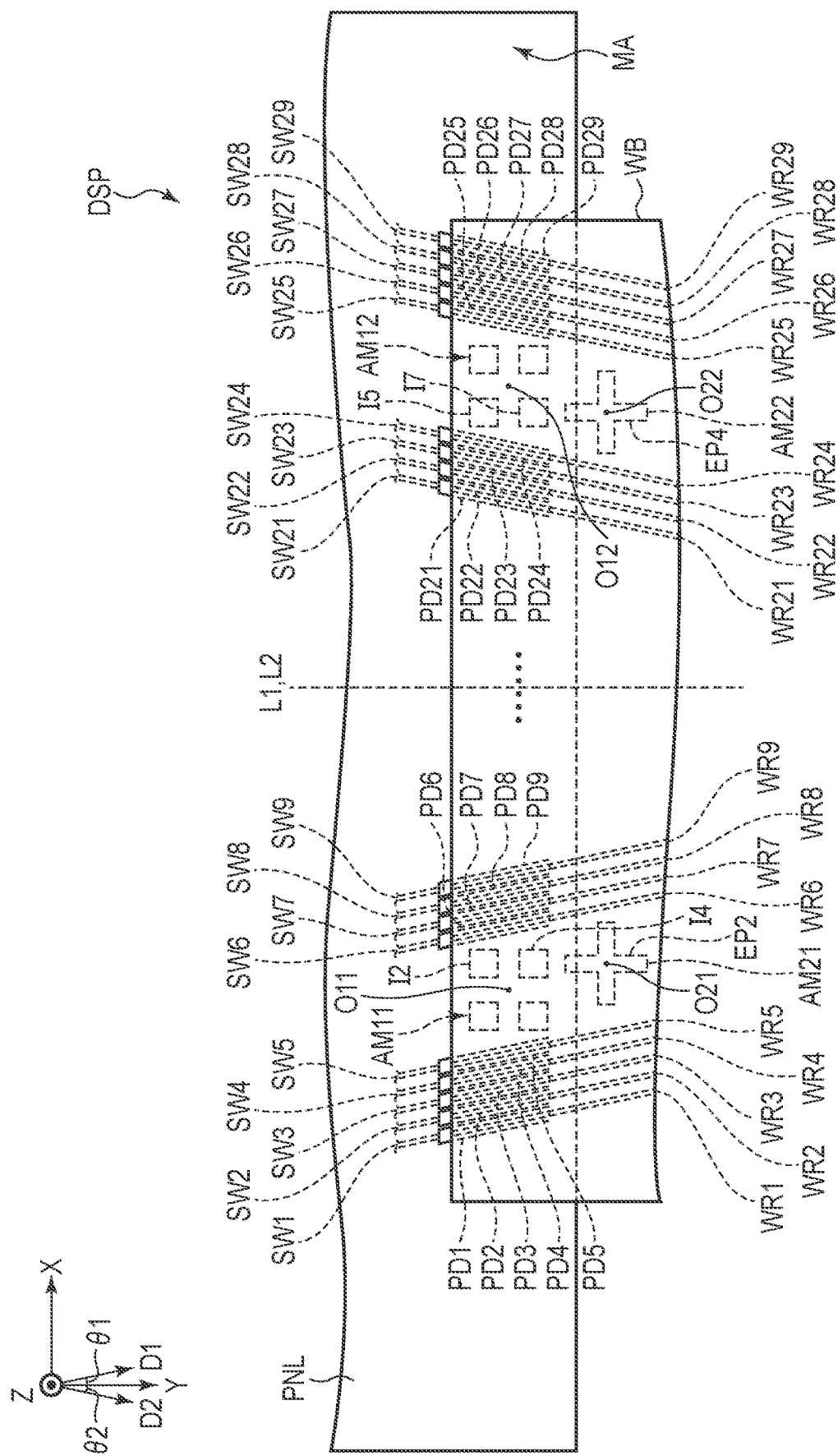
FIG. 5 is a plan view showing a state where the wiring board shown in FIG. 4 is mounted on the mounting portion shown in FIG. 3.

FIG. 5 is a plan view showing a state where the wiring board WB shown in FIG. 4 is mounted on the mounting portion MA shown in FIG. 3. The center line L1 of the mounting portion MA and the center line L2 of the wiring board WB overlap each other.

The connection wiring lines WR1 to WR9 of the wiring board WB are connected to the terminals PD1 to PD9 of the mounting portion MA, respectively. The connection wiring lines WR21 to WR29 of the wiring board WB are connected to the terminals PD21 to PD29 of the mounting portion MA, respectively.

The alignment marks AM11 and AM21 are arranged in parallel in the second direction Y. In addition, the alignment marks AM12 and AM22 are arranged in parallel in the second direction Y. The signal wiring lines SW1 to SW9 and the connection wiring lines WR1 to WR9 located on the left side of the center line L1 extend along the direction D1. Therefore, a center point O11 of the alignment mark AM11 and a center point O21 of the alignment mark AM21 are arranged in parallel along the direction D1. That is, the center point O21 is located on the center line L1 side of the center point O11. The island portions I2 and I4 and the extension portion EP2 are arranged in the second direction Y. In addition, the signal wiring lines SW21 to SW29 and the connection wiring lines WR21 to WR29 located on the right side of the center line L1 extend along the direction D2. Therefore, a center point O12 of the alignment mark AM12 and a center point O22 of the alignment mark AM22 are arranged in parallel along the direction D2. That is, the center point O22 is located on the center line L1 side of the center point O12. The island portions I5 and I7 and the extension portion EP4 are arranged in the second direction Y. The alignment marks are used for aligning the display panel PNL and the wiring board WB when they are connected together. They are aligned when the positions of the alignment marks of them reach predetermined values.

The number of signal wiring lines and the number of connection wiring lines disposed on the right side and the left side of the alignment marks are not limited. Only at least one set of a signal wiring line and a connection wiring line has to be positioned on the left side of the alignment marks AM11 and AM21. Similarly, only at least one set of a signal wiring line and a connection wiring line has to be positioned on the right side of the alignment marks AM12 and AM22. Furthermore, in the illustrated example, the center point of the alignment mark of the display panel PNL and the center point of the alignment mark of the wiring board WB are offset from each other. However, the center point O11 of the alignment mark AM11 and the center point O21 of the alignment mark AM21 may overlap each other, and the center point O12 of the alignment mark AM12 and the center point O22 of the alignment mark AM22 may overlap each other.

Figure 6:
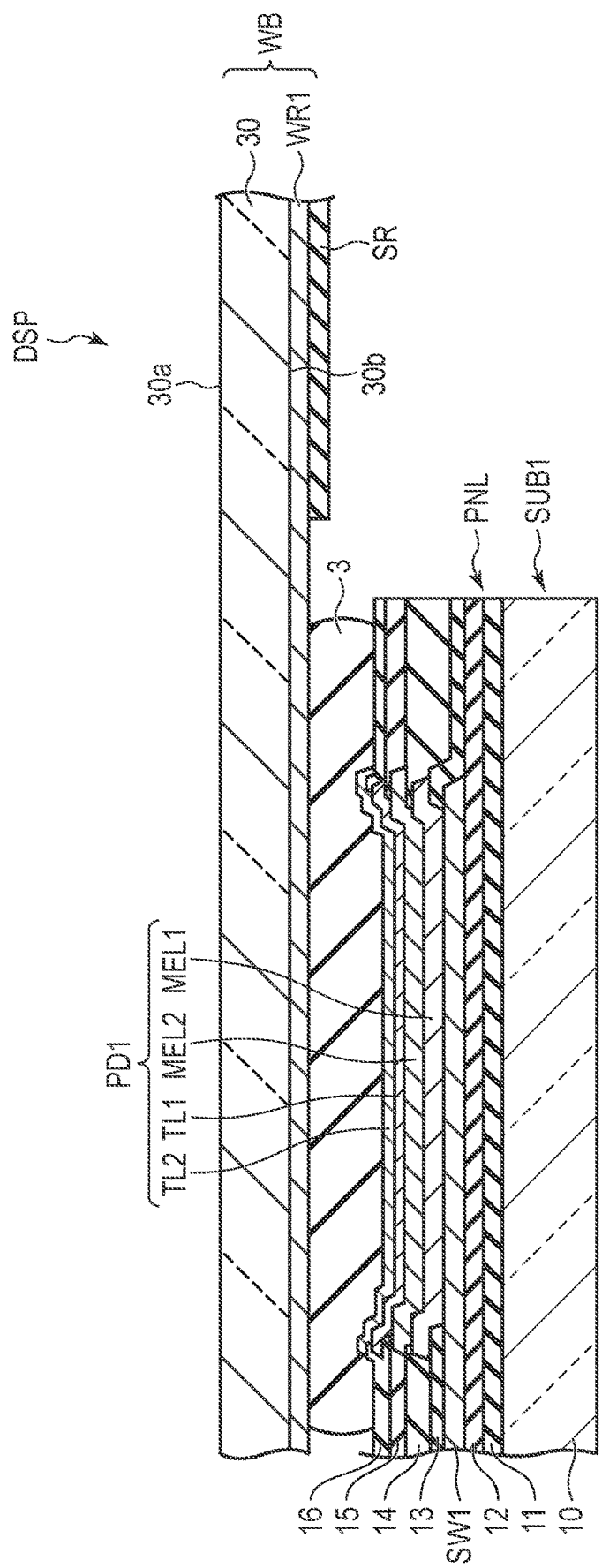
FIG. 6 is a cross-sectional view of the display device along a signal wiring line and a connection wiring line shown in FIG. 5.

FIG. 6 is a cross-sectional view of the display device DSP along the signal wiring line SW1 and the connection wiring line WR1 shown in FIG. 5. That is, FIG. 6 is a plan view along a plane defined by the third direction Z and the direction D1.

The signal wiring line SW1 is located between the insulating film 12 and the insulating film 13. The signal wiring line SW1 is located in the same layer as the scanning line G shown in FIG. 1 and is formed of the same material as the scanning line G. The signal wiring line SW1 and the scanning line G are formed of a metal material such as aluminum (Al), titanium (Ti), silver (Ag), molybdenum (Mo), tungsten (W), copper (Cu) or chromium (Cr), an alloy of these metal materials combined together or the like, and may have a single-layer structure or a multilayer structure. In one example, the signal wiring line SW1 and the scanning line G are formed of a molybdenum tungsten alloy. The alignment marks AM11 and AM12 shown in FIG. 5 are located in the same layer as the signal wiring line SW1, and are formed of the same material as the signal wiring line SW1 and the scanning line G.

The terminal PD1 is composed of metal layers MEL1 and MEL2 and transparent conductive layers TL1 and TL2. The metal layer MEL1 is located between the insulating film 13 and the insulating film 14, and is in contact with the signal wiring line SW1 via a contact hole of the insulating film 13. The metal layer MEL1 is located in the same layer and formed of the same material as the signal lines S1 and S2 shown in FIG. 2. The metal layer MEL1 and the signal lines S1 and S2 are formed of any one of the above-described metal materials, an alloy of the above-described metal materials combined together or the like, and may have a single-layer structure or a multilayer structure. In one example, the metal layer MEL1 and the signal lines S1 and S2 are formed of a layer stack of the first layer containing titanium (Ti), the second layer containing aluminum (Al) and the third layer containing titanium (Ti) stacked in this order.

The metal layer MEL2 is located between the insulating film 14 and the insulating film 15, and is in contact with the metal layer MEL1 via a contact hole of the insulating film 14. The metal layer MEL2 is located in the same layer and formed of the same material as the metal wiring lines ML1 and ML2 shown in FIG. 2. The metal layer MEL2 and the metal wiring lines ML1 and ML2 are formed of any one of the above-described metal materials, an alloy of the above-described metal materials combined together or the like, and may have a single-layer structure or a multilayer structure. In one example, the metal layers MEL2 and the metal wiring lines ML1 and ML2 each are a layer stack of the first layer containing titanium (Ti), the second layer containing aluminum (Al) and the third layer containing titanium (Ti) stacked in this order, or a layer stack of the first layer containing molybdenum (Mo), the second layer containing aluminum (Al) and the third layer containing molybdenum (Mo) stacked in this order.

The transparent conductive layer TL1 is located between the insulating film 15 and the insulating film 16, and is in contact with the metal layer MEL2 via a contact hole of the insulating film 15. The transparent conductive layer TL1 is located in the same layer and formed of the same material as the common electrode CE shown in FIG. 2. The transparent conductive film TL2 is located on the insulating film 16 and is in contact with the transparent conductive film TL1 via a contact hole of the insulating film 16. The transparent conductive film TL2 is located in the same layer and formed of the same material as the pixel electrode PE shown in FIG. 2.

The wiring board WB comprises an insulating substrate 30, the connection wiring line WR1, and a solder resist SR covering the connection wiring line WR1. The insulating substrate 30 comprises an upper surface 30a and a lower surface 30b. The insulating substrate 30 is formed of, for example, polyimide. The connection wiring line WR1 is located on the lower surface 30b of the insulating substrate 30. The solder resistor SR does not extend to a position opposed to the terminal PD1 of the display panel PNL but exposes the connection wiring line WR1 at the position opposed to the terminal PD1. The wiring board WB is electrically connected and bonded to the display panel PNL by an anisotropic conductive film 3 which is a conductive material. That is, the anisotropic conductive film 3 is interposed between the first substrate SUB1 and the wiring board WB. The wiring board WB and the display panel PNL are electrically and physically connected together by pressing them from above and below in the third direction Z with the anisotropic conductive film 3 interposed and heating them.

The anisotropic conductive film 3 connects the terminals PD1 to PD5 and the connection wiring lines WR1 to WR5, the terminals PD6 to PD9 and the connection wiring lines WR6 to WR9, the terminals PD21 to PD24 and the connection wiring lines WR21 to WR24, and the terminals PD25 to PD29 and the connection wiring lines WR25 to WR29 shown in FIG. 5.

Figure 7:
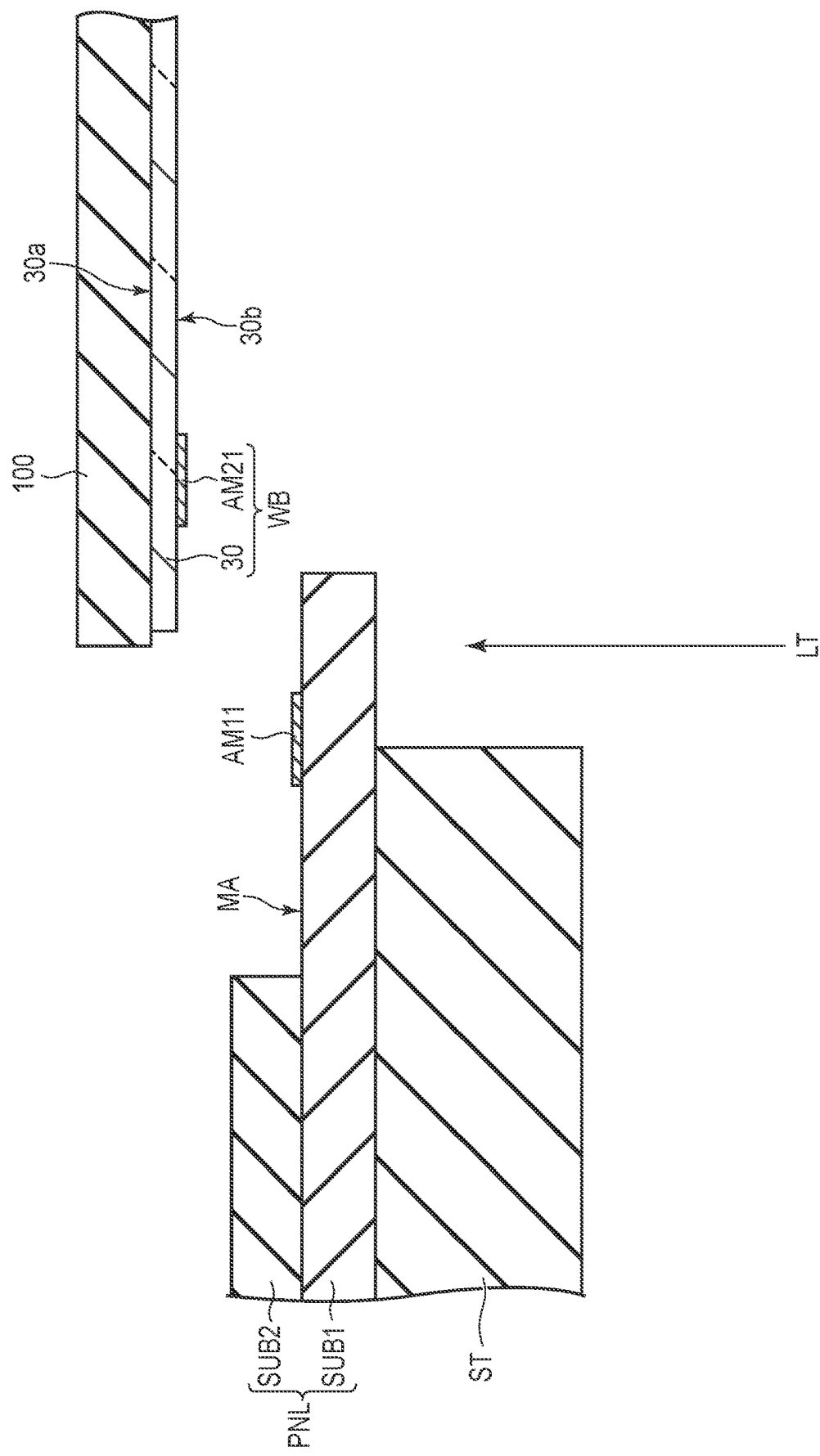
FIG. 7 is a cross-sectional view of a process of mounting the wiring board on the display panel.

FIG. 7 is a cross-sectional view showing a process of mounting the wiring board WB on the display panel PNL.

Figure 8:
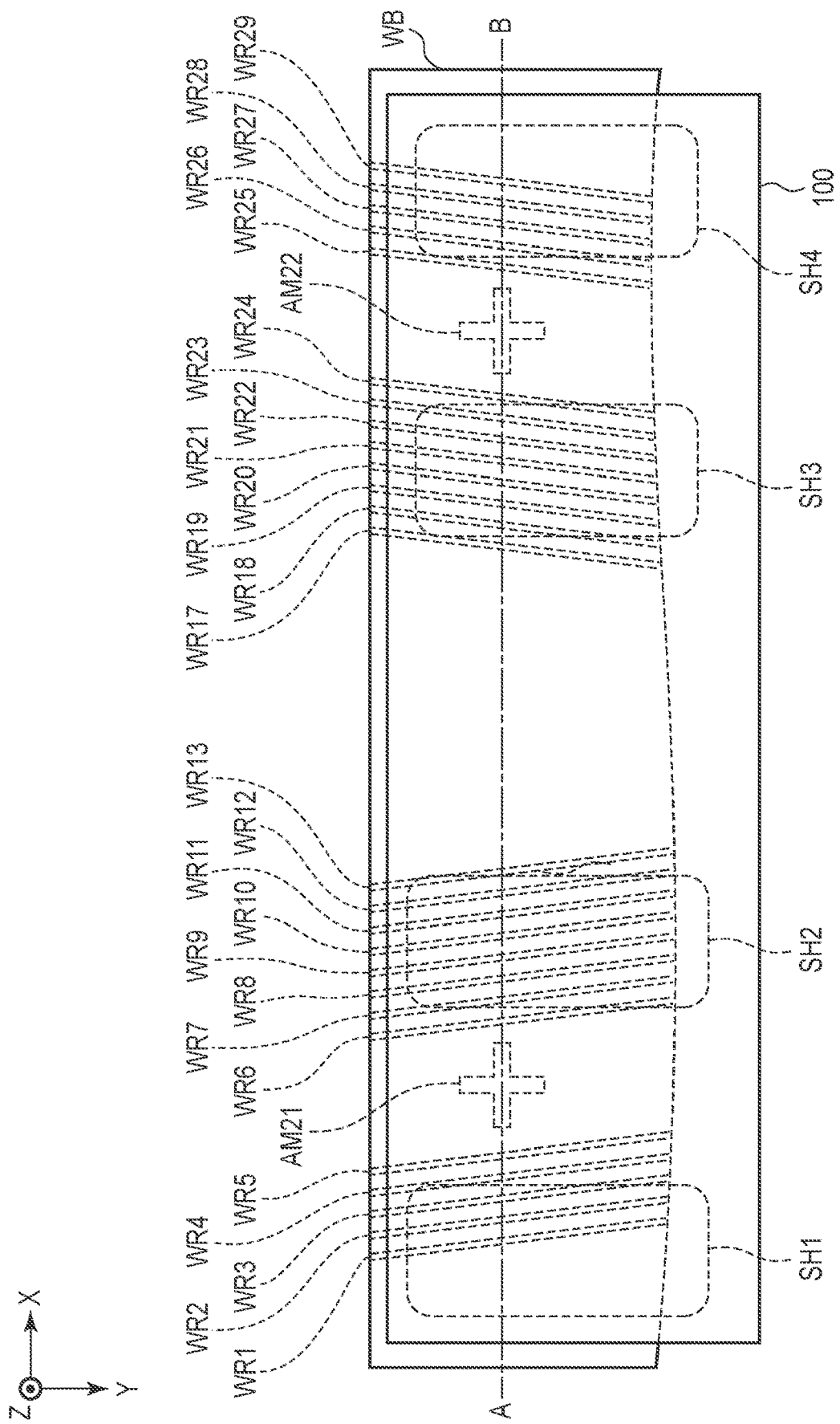
FIG. 8 is a plan view showing the wiring board and a suction device shown in FIG. 7.
Figure 9:
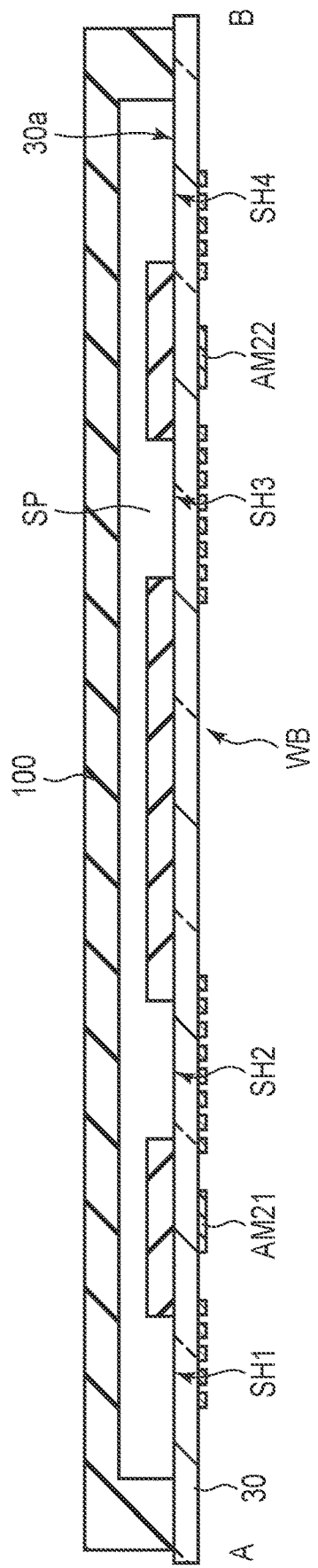
FIG. 9 is a cross-sectional view showing the wiring board and the suction device along line A-B shown in FIG. 8.

The display panel PNL is disposed on a stage ST. As shown in FIGS. 8 and 9, the wiring board WB is attracted to a suction device 100. The suction device 100 comprises a space inside, and turns the space into a vacuum and attracts the wiring board WB. The suction device 100 attracts the upper surface 30a of the insulating substrate 30. The alignment mark AM21 of the wiring board WB is located on the lower surface 30b side of the insulating substrate 30.

The mounting of the wiring board WB on the display panel PNL takes the following procedure. Light LT is emitted from below the display panel PNL, and an image is captured from below the display panel PNL by a camera for recognizing the alignment marks. A manufacturing device recognizes the position of the alignment mark of the display panel PNL and the position of the alignment mark of the wiring board WB, and aligns the display panel PNL and the wiring board WB. Then, the display panel PNL and the wiring board WB are bonded with the anisotropic conductive film interposed by thermocompression bonding.

FIG. 8 is a plan view showing the wiring board WB and the suction device 100 shown in FIG. 7. FIG. 8 is a plan view from above the suction device 100 shown in FIG. 7.

The suction device 100 comprises suction ports SH1 to SH4 arranged in the first direction X. In the illustrated example, the suction port SH1 overlaps the connection wiring lines WR1 to WR4, the suction port SH2 overlaps the connection wiring lines WR6 to WR13, the suction port SH3 overlaps the connection wiring lines WR17 to WR24, and the suction port SH4 overlaps the connection wiring line WR25 to WR29. The alignment mark AM21 is located between the suction port SH1 and the suction port SH2. The alignment mark AM22 is located between the suction port SH3 and the suction port SH4. As described above, the suction device 100 attracts the wiring board WB such that the suction ports are located on the right side and the left side of the alignment mark. The suction device 100 sucks both sides of the alignment mark AM21 and both sides of the alignment mark AM22. The suction device 100 comprises suction ports (not shown) also between the suction port SH2 and the suction port SH3. The display panel PNL and the wiring board WB are aligned by the alignment marks AM11 and AM21 and aligned by the alignment marks AM12 and AM22 as shown in FIG. 5. At this time, the alignment marks AM11 and AM21 do not overlap each other, and the alignment marks AM12 and AM22 do not overlap each other.

FIG. 9 is a cross-sectional view showing the wiring board WB and the suction device 100 along line A-B shown in FIG. 8.

The suction device 100 comprises a space SP inside. The space SP communicates with the suction ports SH1 to SH4. The suction ports SH1 to SH4 are hermetically closed by the upper surface 30a of the insulating substrate 30.

The wiring board WB tends to roll up under no external force. Since the suction ports SH1 and SH2 attract areas on the right side and the left side of the alignment mark AM21, a part of the wiring board WB in which the alignment mark AM21 is located can be maintained flat. Similarly, since the suction ports SH3 and SH4 attract areas on the right side and the left side of the alignment marks AM22, a part of the wiring board WB in which the alignment mark AM22 is located can be maintained flat.

Figure 10:
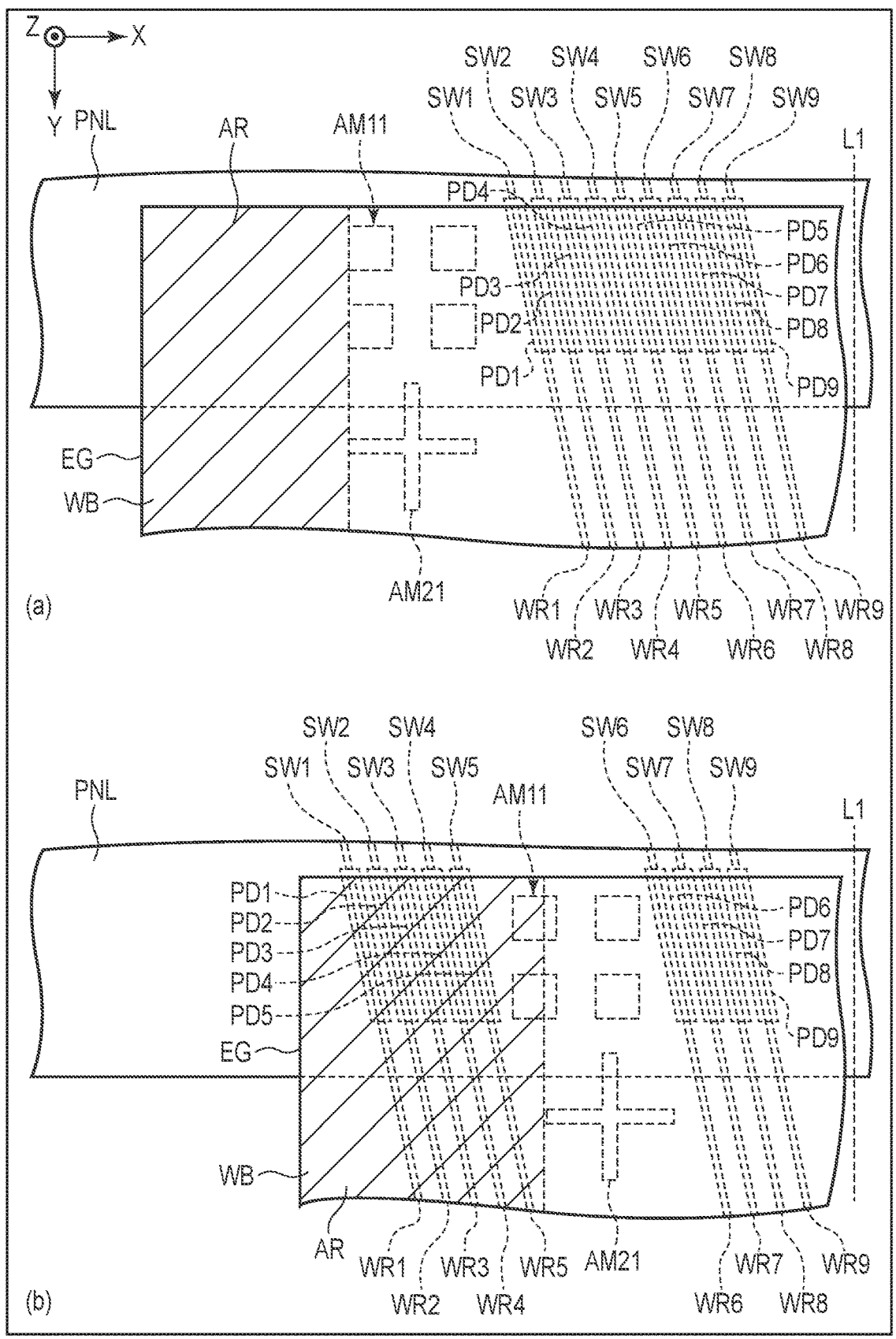
FIG. 10 is a plan view showing a comparison on the mounting portion between a comparative example and the present embodiment.

FIG. 10 is a plan view showing a comparison on the positions of the alignment marks AM11 and AM12 between a comparative example and the present embodiment. FIG. 10 (a) is a plan view showing the comparative example, and FIG. 10 (b) is a plan view showing the present embodiment. In FIG. 10, the configuration on the left side of the center line L1 is illustrated. Since the configuration on the right side of the center line L1 is similar to this configuration, description will be omitted.

In the comparative example shown in FIG. 10 (a), the alignment marks AM11 and AM2l are located more outward than the signal wiring line SW1 and the connection wiring line WR1. In order to position the suction ports of the suction device on the right side and the left side of the alignment mark AM21, it is necessary to secure a suction area for positioning the suction port on the left side of the alignment mark AM21. The suction area AR corresponds to an area indicated by hatch lines in the drawing. For example, in the comparative example, the width in the first direction X of the suction area AR is about greater than or equal to 0.65 mm.

According to the present embodiment, as shown in FIG. 10 (b), the alignment marks AM11 and AM21 are located between the signal wiring line SW5 and the connection wiring line WR5 and the signal wiring line SW6 and the connection wiring line WR6. Therefore, the suction area AR overlaps the connection wiring lines WR1 to WR5. That is, the suction area AR and the area for disposing the connection wiring lines WR1 to WR5 can be combined. Therefore, the distance from the center line L1 to an edge portion EG of the wiring board WB can be reduced as compared with the comparative example. For example, the distance from the edge portion EG of the wiring board WB to the center line L1 can be reduced by about 0.35 mm as compared with the comparative example. In addition, for example, also in the present embodiment, the width in the first direction X of the suction area AR is about greater than or equal to about 0.65 mm. As described above, it is possible to reduce the width of the wiring board WB without reducing the suction area AR. Furthermore, since the width of the wiring substrate WB can be reduced, the wiring board WB fit for the miniaturization of the display panel PNL can be manufactured.

Furthermore, the connection wiring line WR1 can be located close to the edge portion EG, and the area for disposing the connection wiring lines WR can be increased. Therefore, the number of connection wiring lines WR can be increased or the pitch of the connection wiring lines WR can be increased. Furthermore, when the pitch is increased, the width of the connection wiring lines WR can be increased, and the resistance can be reduced. When the number, the pitch and the width of the connection wiring lines WR are increased, the number, the pitch and the width of the signal wiring lines SW of the display panel PNL can be increased, accordingly. Furthermore, when the pitch and the width of the signal wiring lines SW and the pitch and the width of the connection wiring lines WR are increased, the risk of the misalignment of the display panel PNL and the wiring board WB can be reduced. Note that it is also possible to increase the area for disposing the connection wiring lines WR without reducing the width of the wiring board WB.

Figure 11:
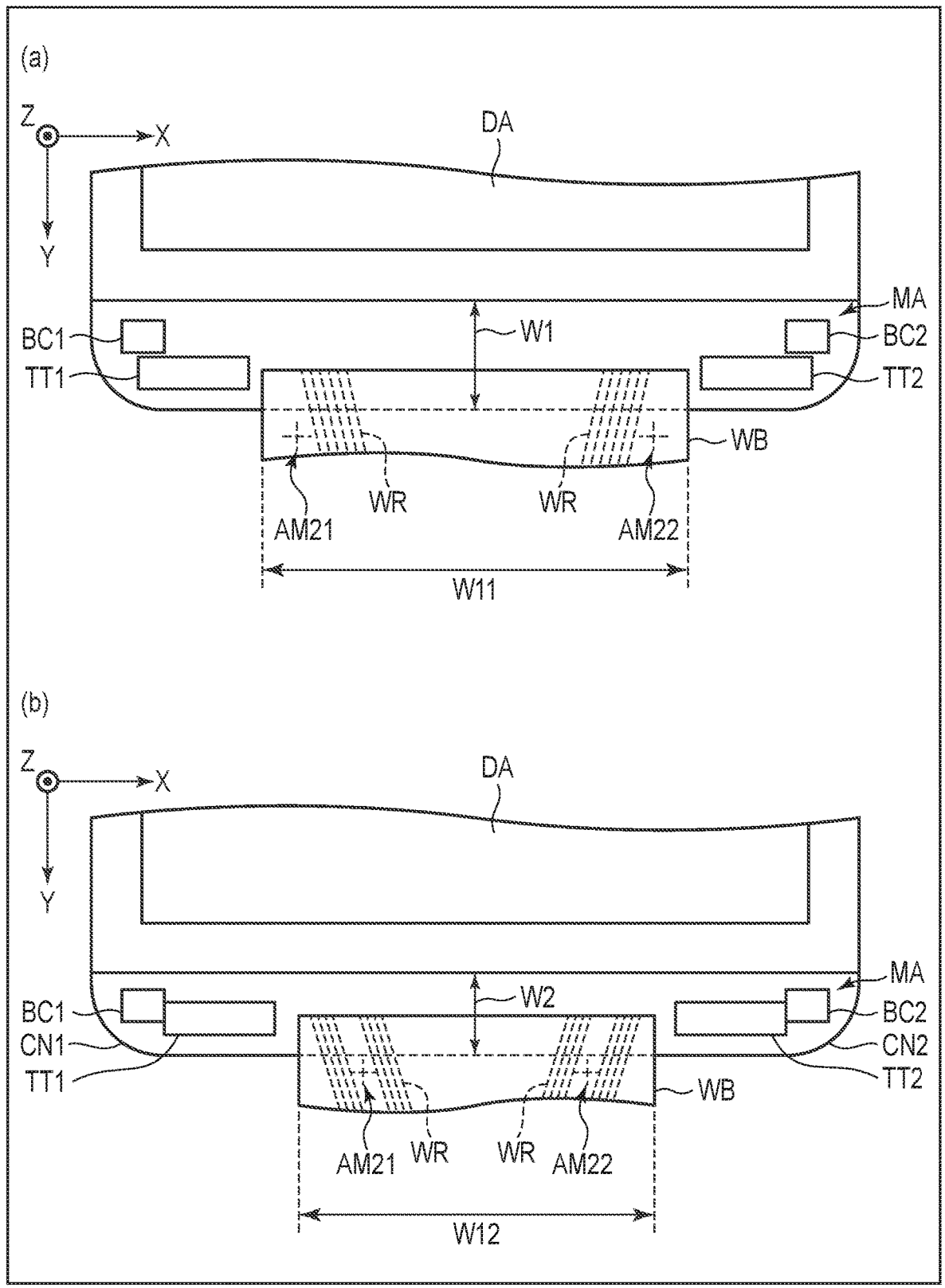
FIG. 11 is a plan view showing a comparison on the width of the non-display area in accordance with a change of the width of the wiring board.

FIG. 11 is a plan view showing a comparison on the mounting portion MA between a comparative example and the present embodiment. FIG. 11 (a) is a plan view showing the comparative example, and FIG. 11 (b) is a plan view showing the present embodiment.

The display device DSP comprises barcodes BC1 and BC2 located in the mounting portion MA and test terminals TT1 and TT2 located in the mounting portion MA. In the example shown in FIG. 11 (a), the barcode BC1 and the test terminal TT1 are arranged in the second direction Y on the left side of the wiring board WB, and the barcode BC2 and the test terminal TT2 are arranged in the second direction Y on the right side of the wiring board WB. The wiring board WB has a width W11 in the first direction X. In addition, the mounting portion MA has a width W1 in the second direction Y.

As shown in FIG. 11 (b), in the present embodiment, the wiring board WB has a width W12 in the first direction X, and the width W12 is less than the width W11. Therefore, areas on the right side and the left side of the wiring board WB can be expanded as compared with the comparative example. That is, the barcode BC1 and the test terminal TT1 can be arranged in the first direction X on the left side of the wiring board WB, and the barcode BC2 and the test terminal TT2 can be arranged in the first direction X on the right side of the wiring board WB. Therefore, the width W2 in the second direction Y of the mounting portion MA can be made less than the width W1 of the comparative example. In the illustrated example, the barcode and the test terminal are taken as an example. However, the elements are not limited to them but may be other members.

In addition, since the areas on the right side and the left side of the wiring board WB can be expanded in the mounting portion MA, the curvatures of corner portions CN1 and CN2 of the display panel PNL can be expanded. That is, the desired corner portions CN1 and CN2 according to the requested shape of the display device can be formed. Furthermore, since the connection wiring lines WR of the wiring board WB can be located more outward, an area for drawing signal wiring lines to be connected can be reduced, and the non-display area NDA on the mounting portion MA side can be reduced.

Figure 12:
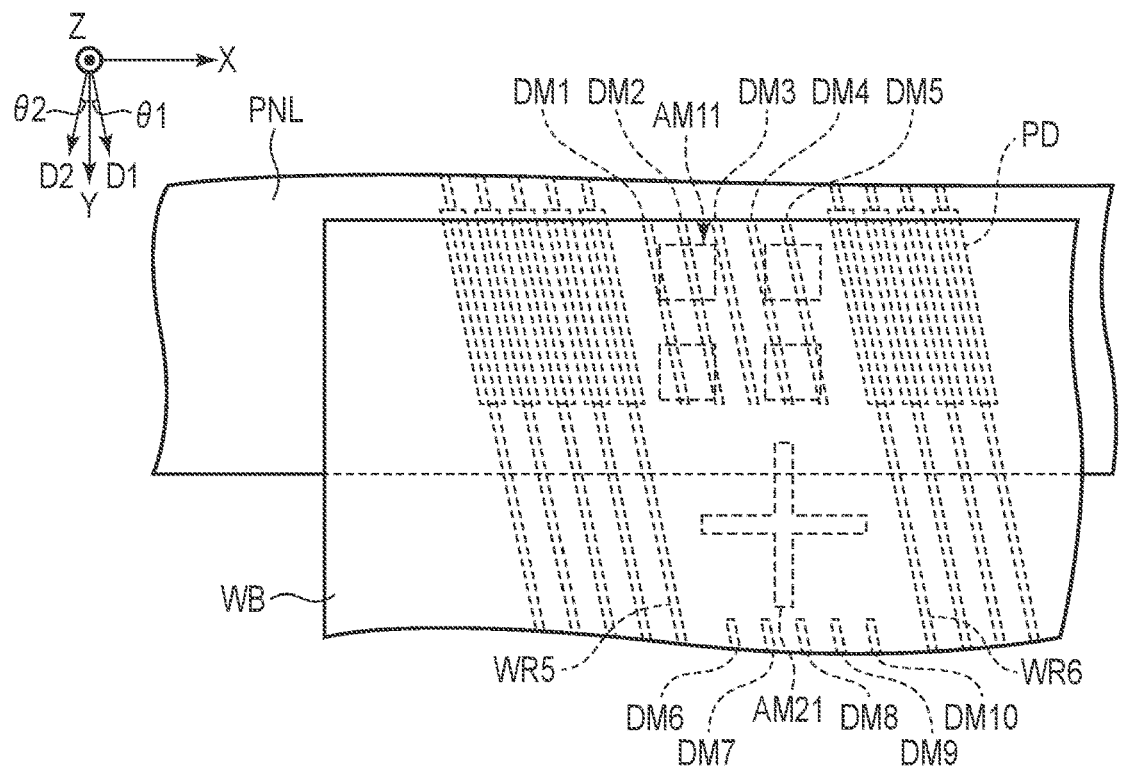
FIG. 12 is a plan view showing the first modification example of the present embodiment.

FIG. 12 is a plan view showing the first modification example of the present embodiment. The configuration shown in FIG. 12 is different from the configuration shown in FIG. 10 (b) in that dummy terminals DM1 to DM10 are disposed.

The wiring board WB comprises dummy terminals DM1 to DM5 overlapping the alignment mark AM11, and dummy terminals DM6 to DM10 located on an opposite side to the dummy terminals DM1 to DM5 with respect to the alignment mark AM21. The dummy terminals DM1 to DM10 are located between the connection wiring line WR5 and the connection wiring line WR6 and extend along the direction D1. The dummy terminals DM6 to DM10 do not overlap the alignment mark AM11. By disposing the dummy terminals DM1 to DM10, the layer thickness of the wiring board WB can be made uniform. In particular, the layer thickness of the wiring board WB is made uniform in portions overlapping the terminals PD and the alignment mark AM11, and the display panel PNL and the wiring board WB can be compressed and bonded by the anisotropic conductive film more easily.

Effects similar to those produced in the above-described embodiment can also be produced in the first modification example.

Figure 13:
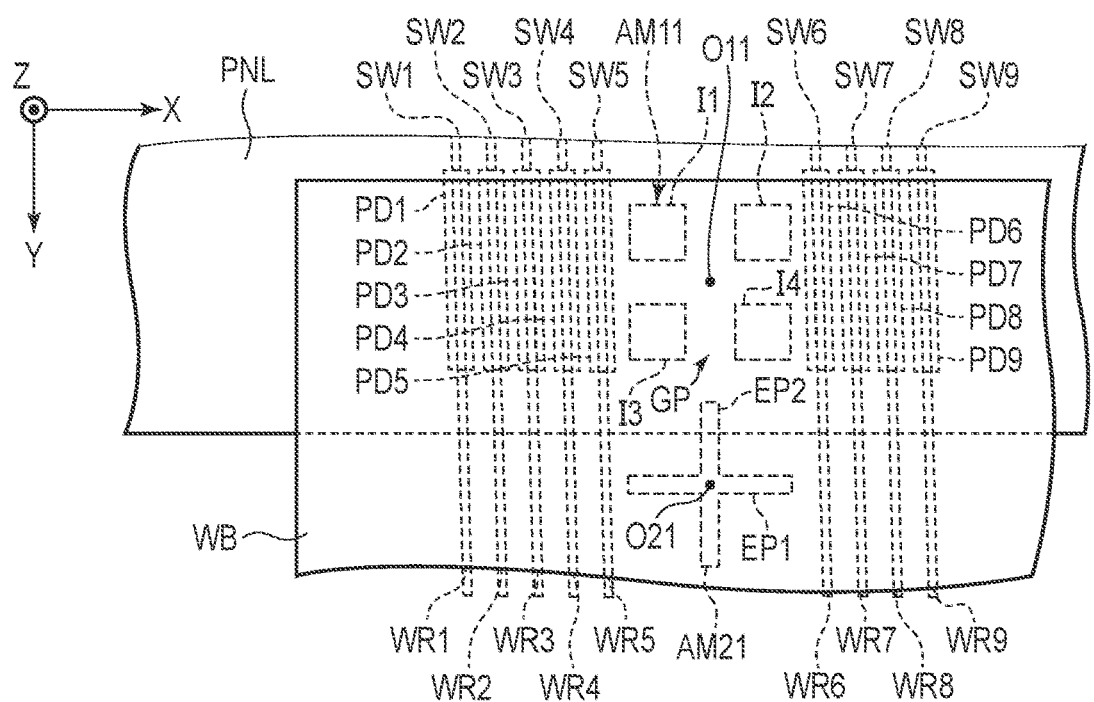
FIG. 13 is a plan view showing the second modification example of the present embodiment.

FIG. 13 is a plan view showing the second modification example of the present embodiment. The configuration of FIG. 13 is different from the configuration shown in FIG. 10 (b) in that the signal wiring lines SW1 to SW9, the terminals PD1 to PD9, and the connection wiring lines WR1 to WR9 extend along the second direction Y.

The center point O11 of the alignment mark AM11 and the center point O21 of the alignment mark AM21 are arranged in parallel along the second direction Y. The alignment mark AM11 comprises a gap GP along the second direction Y between the island portions I1 and I3 and the island portions I2 and I4. The gap GP and the extension portion EP2 of the alignment mark AM21 are arranged in the second direction Y.

Effects similar to those produced in the above-described embodiment can also be produced in the second modification example.

As described above, according to the present embodiment, a display device, a display panel and a wiring board which can achieve miniaturization can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel comprising a first substrate; and
a wiring board mounted on a mounting portion of the first substrate, wherein
the display panel comprises a first terminal and a second terminal located in the mounting portion, a first alignment mark located in the mounting portion and located between the first terminal and the second terminal, a first wiring line connected to the first terminal, and a second wiring line connected to the second terminal, and the wiring board comprises a first connection wiring line connected to the first terminal, a second connection wiring line connected to the second terminal, and a second alignment mark located between the first connection wiring line and the second connection wiring line, the first terminal, the first alignment mark, and the second terminal are arranged in parallel in a first direction, the first connection wiring line, the second alignment mark, and the second connection wiring line are arranged in parallel in the first direction, the first alignment mark and the second alignment mark are arranged in parallel in a second direction crossing the first direction, the wiring board further comprises a first dummy terminal overlapping the first alignment mark, and a second dummy terminal located on an opposite side to the first dummy terminal with respect to the second alignment mark, and the first dummy terminal and the second dummy terminal are located between the first connection wiring line and the second connection wiring line.

2. The display device of claim 1, wherein
the wiring board comprises a driver IC chip which drives the display panel, and
the first connection wiring line and the second connection wiring line are connected to the driver IC chip.

3. The display device of claim 1, wherein
the first terminal, the second terminal, the first connection wiring line, and the second connection wiring line are inclined with respect to the second direction, and a center of the second alignment mark is located on a side on which a center of a width in the first direction of the wiring board is located with respect to a center of the first alignment mark.

4. The display device of claim 1, wherein
the first alignment mark comprises a first island portion, a second island portion arranged in parallel in a first direction of the first island portion, a third island portion arranged in parallel in a second direction crossing the first direction of the first island portion, and a fourth island portion arranged in parallel in the second direction of the second island portion, and the second alignment mark is formed in a cross shape comprising a first extension portion extending in the first direction and a second extension portion extending in the second direction.

5. The display device of claim 1, wherein a barcode, a test terminal and the wiring board are arranged in parallel in a first direction.

6. The display device of claim 1, wherein
the display panel further comprises a third terminal and a fourth terminal located in the mounting portion, a third alignment mark located in the mounting portion and located between the third terminal and the fourth terminal, a third wiring line connected to the third terminal, and a fourth wiring line connected to the fourth terminal, and the wiring board comprises a third connection wiring line connected to the third terminal, a fourth connection wiring line connected to the fourth terminal, and a fourth alignment mark located between the third connection wiring line and the fourth connection wiring line.

\* \* \* \* \*